US012787529B2

(12) United States Patent

He et al.

(10) Patent No.: US 12,787,529 B2

(45) Date of Patent: Nov. 3, 2026

(54) MICRO LIGHT-EMITTING DIODE PANEL STRUCTURE

(71) Applicant: RAYLEIGH VISION INTELLIGENCE CO. LTD., Hsinchu City (HK)

(72) Inventors: Jr-Hau He, Hsinchu City (TW); Chun-Wei Tsai, New Taipei City (TW); Zhi-Ting Ye, Miaoli County (TW); Yuk-Tong Cheng, Kowloon (HK)

(73) Assignee: RAYLEIGH VISION INTELLIGENCE CO. LTD., Hsinchu City (TW)

( * ) Notice: Subject to any disclaimer, the term of this patent is extended or adjusted under 35 U.S.C. 154(b) by 406 days.

(21) Appl. No.: 18/200,848

(22) Filed: May 23, 2023

(65) Prior Publication Data

US 2024/0395849 A1 Nov. 28, 2024

(51) Int. Cl.

*H10H 29/10* (2025.01)
*B82Y 20/00* (2011.01)
*H10H 20/851* (2025.01)

(52) U.S. Cl.

CPC ........ *H10H 29/10* (2025.01); *H10H 20/8512* (2025.01); *B82Y 20/00* (2013.01)

(58) Field of Classification Search

CPC .. H10H 29/10; H10H 20/8512; H10H 29/142; B82Y 20/00; H01L 25/0753; H01L 27/156; H01L 33/30; H01L 33/486; H01L 33/54; H10W 90/00

See application file for complete search history.

(56) References Cited

U.S. PATENT DOCUMENTS

| | | | | |
|---|---|---|---|---|
| 12,148,630 | B2 | 11/2024 | Chen | |
| 2020/0235128 | A1* | 7/2020 | Shin | H10D 86/60 |
| 2021/0305220 | A1* | 9/2021 | Xu | H10H 29/142 |
| 2022/0102583 | A1 | 3/2022 | Baumheinrich | |
| 2022/0246670 | A1* | 8/2022 | Chen | H10H 29/10 |
| 2023/0238499 | A1 | 7/2023 | Jong | |
| 2023/0411406 | A1 | 12/2023 | Kim | |
| 2025/0089442 | A1* | 3/2025 | Wang | H10K 59/876 |

FOREIGN PATENT DOCUMENTS

| | | |
|---|---|---|
| TW | I804145 B | 6/2023 |
| TW | 202418579 A | 5/2024 |

OTHER PUBLICATIONS

The First Office Action for TW Application No. 113128619 was issued by TIPO on Feb. 18, 2025.

* cited by examiner

*Primary Examiner* — Jonathan Han

(74) *Attorney, Agent, or Firm* — WPAT, PC

(57) ABSTRACT

The present invention provides a micro light-emitting diode panel structure, which comprises a substrate with two regions. A first region of the substrate includes a first light-emitting layer, a second light-emitting layer, and a third light-emitting layer stacked sequentially. The substrate, the first light-emitting layer, the second light-emitting layer, and the third light-emitting layer are connected electrically via fan-out circuit layers, respectively. When one or more of the light-emitting layers is damaged, one or more first alternate light-emitting layer is disposed in the second region correspondingly for repairing the micro light-emitting diode panel.

13 Claims, 8 Drawing Sheets

1

1

MICRO LIGHT-EMITTING DIODE PANEL STRUCTURE

BACKGROUND OF THE INVENTION

The micro light-emitting diode (micro LED) is a novel display technology formed by miniature light-emitting chips. In comparison to the LED or organic LED (OLED) display technology according to the prior art, micro LEDs own higher brightness, contrast, and color expressiveness as well as greater performance and longer lifetime.

Compared with the display technologies according to the prior art, micro LEDs own many advantages including primarily the brightness and contrast. The brightness of a micro LED can reach ten times the brightness of a general OLED. The contrast of a micro LED is also higher. These advantages make micro LED displays are apparently superior in color reproduction and image quality.

The advantage of micro LEDs is their color expressiveness. Since micro LED displays adopt pure light sources, they can display a broader color gamut and hence providing truer and more vivid colors. In addition, micro LED displays also provide local brightness adjustment. This means that they can adjust brightness in different regions of a display independently and thus achieving superior contrast and performance.

The third advantage is greater performance and longer lifetime. In addition, micro LEDs use pure light sources. Thereby, no backlight and color filter layer is required, which enhances the light-emitting efficiency.

Owing to the advantages of micro LEDs, they have become the primary choice for high-end display products, including smartphones, tablet computers, televisions, VR/AR helmets, and automotive displays.

As consumers requests for higher quality and resolution, the micro LED technology has attracted more attention. Compared to LCD displays, LED displays, and OLED displays, micro LED displays have higher brightness and better contrast. Besides, they also have a broader color gamut. Consequently, micro LED displays have been regarded as an important development direction for next-generation display technologies.

Furthermore, the advantages of micro LEDs also include reliability and long-term costs. Thanks to their long lifetime and durability, compared to other technologies, micro LEDs are more economical. In addition, due to their low power consumption and long lifetime, this technology can maintain high-quality displays for a long time without excessive maintenance or replacement of parts.

Unfortunately, owing to its miniature size, massive micro LEDs are required to be disposed on the display panel according to the prior art. Because of imperfect process yield, some LEDs cannot operate normally and thus resulting in defective pixels on a micro LED panel. Accordingly, the industry requires a micro LED panel structure capable of repairing abnormal pixels.

To solve the above problem according to the prior art, the present invention provides a micro LED panel structure, which comprises two or more regions on the substrate. The first region includes a plurality of light-emitting layers stacked vertically. When one of the plurality of vertically stacked light-emitting layers is damaged, an alternate light-emitting layer is disposed in the second region.

SUMMARY OF THE INVENTION

An objective of the present invention is to provide a micro LED panel structure, in which two or more regions are disposed on the substrate. The first region includes a plurality of light-emitting layers stacked vertically. When one of the plurality of vertically stacked light-emitting layers is damaged, an alternate light-emitting layer is disposed in the second region.

To achieve the above objective and efficacy, the present invention provides a micro LED panel structure, which comprises a substrate, a first light-emitting layer, a second light-emitting layer, and a third light-emitting layer. The substrate includes a first region and a second region thereon. The first region is disposed on one side of the second region. The first light-emitting layer is disposed in the first region. And connected electrically to the substrate via a first fan-out circuit layer from the bottom. The second light-emitting layer is disposed on the first light-emitting layer and connected electrically to the first light-emitting layer via a second fan-out circuit layer from the bottom. The second fan-out circuit layer is connected electrically to the substrate. The third light-emitting layer is disposed on the second light-emitting layer and connected electrically to the second light-emitting layer via a third fan-out circuit layer from the bottom. The third fan-out circuit layer is connected electrically to the substrate. The wavelengths of the light emitted from the first, the second, and the third light-emitting layers are different. When one or more of the first, the second, and the third light-emitting layers is damaged, one or more first alternate light-emitting layer is disposed in the second region. The one or more first alternate light-emitting layer is connected electrically to the substrate via a fourth fan-out circuit layer from the bottom. By using the structure, the micro LED panel structure can be repaired correspondingly.

According to an embodiment of the present invention, the material of the substrate is selected from the group consisting of gallium nitride, gallium arsenide, gallium phosphide, indium phosphide, silicon carbide, and aluminum oxide.

According to an embodiment of the present invention, the micro LED panel structure further comprises a quantum dot layer disposed on the one or more first alternate light-emitting layer.

According to an embodiment of the present invention, the micro LED panel structure further comprises one or more second alternate light-emitting layer disposed on the third light-emitting layer.

According to an embodiment of the present invention, the one or more second alternate light-emitting layer is connected electrically to the third light-emitting layer via a fifth fan-out circuit layer from the bottom.

According to an embodiment of the present invention, the wavelength of the light emitted from the one or more second alternate light-emitting layer is different from the wavelength of the light emitted from the third light-emitting layer.

According to an embodiment of the present invention, the first light-emitting layer, the second light-emitting layer, and the third light-emitting layer include an n-type semiconductor, a p-type semiconductor, and a light-emitting layer, respectively.

According to an embodiment of the present invention, the energy bandgap of the first light-emitting layer is greater than the energy bandgap of the second light-emitting layer; the energy bandgap of the second light-emitting layer is greater than the energy bandgap of the third light-emitting layer.

According to an embodiment of the present invention, the energy bandgap of the first light-emitting layer is smaller than the energy bandgap of the second light-emitting layer;

the energy bandgap of the second light-emitting layer is smaller than the energy bandgap of the third light-emitting layer.

According to an embodiment of the present invention, a first area of the first light-emitting layer is greater than a second area of the second light-emitting layer. The second area is greater than a third area of the third light-emitting layer.

DETAILED DESCRIPTION OF THE INVENTION

In order to make the structure and characteristics as well as the effectiveness of the present invention to be further understood and recognized, the detailed description of the present invention is provided as follows along with embodiments and accompanying figures.

To solve the above problem according to the prior art, the present invention provides a micro LED panel structure, in which two or more regions are disposed on the substrate. A first region includes a plurality of light-emitting layers stacked vertically and connected electrically to one another. When one or more of the plurality of light-emitting layers is damaged, an alternate light-emitting layer is disposed in a second region for repairing the micro LED panel and hence solving the problem of defective pixels owing to abnormal or damaged LEDs on the panel according to the prior art.

Figure 1A:
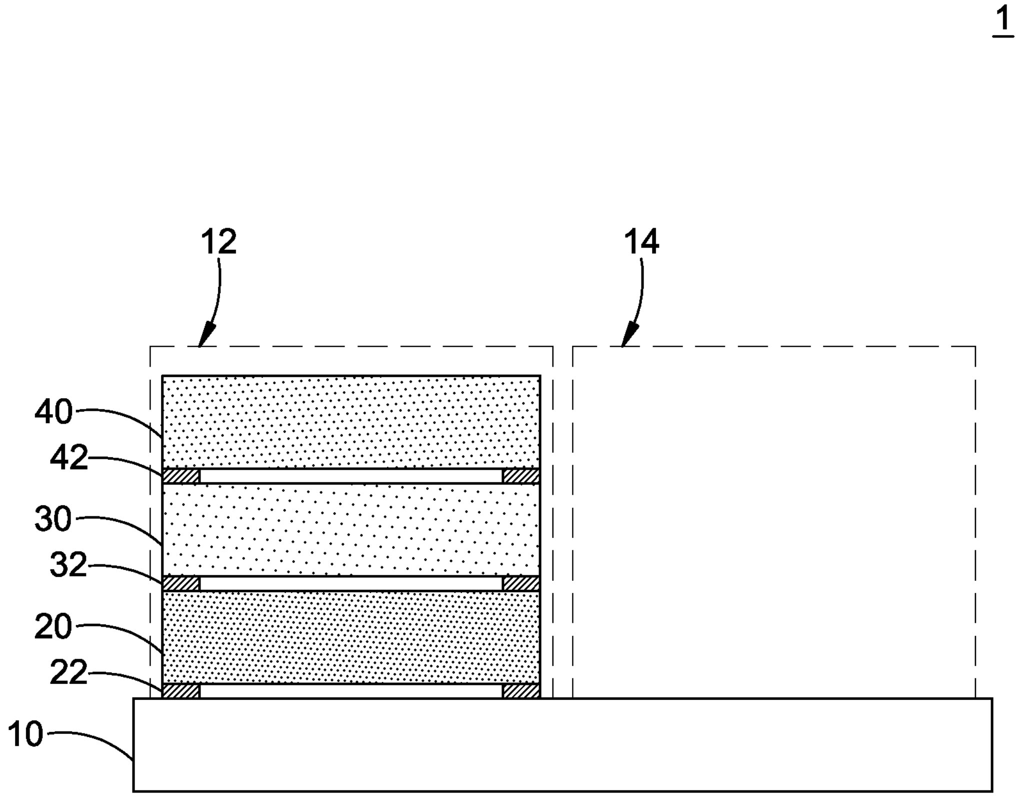
FIG. 1A shows a schematic diagram of the structure according to an embodiment of the present invention.
Figure 1B:
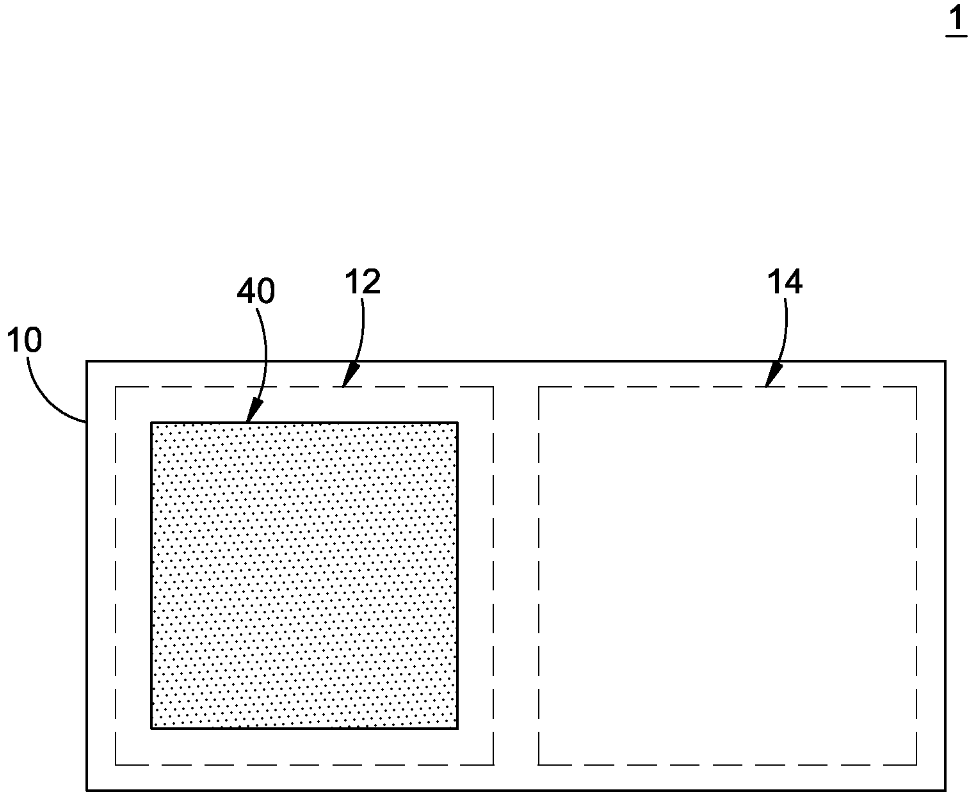
FIG. 1B shows a top view of the structure according to an embodiment of the present invention.
Figure 1C:
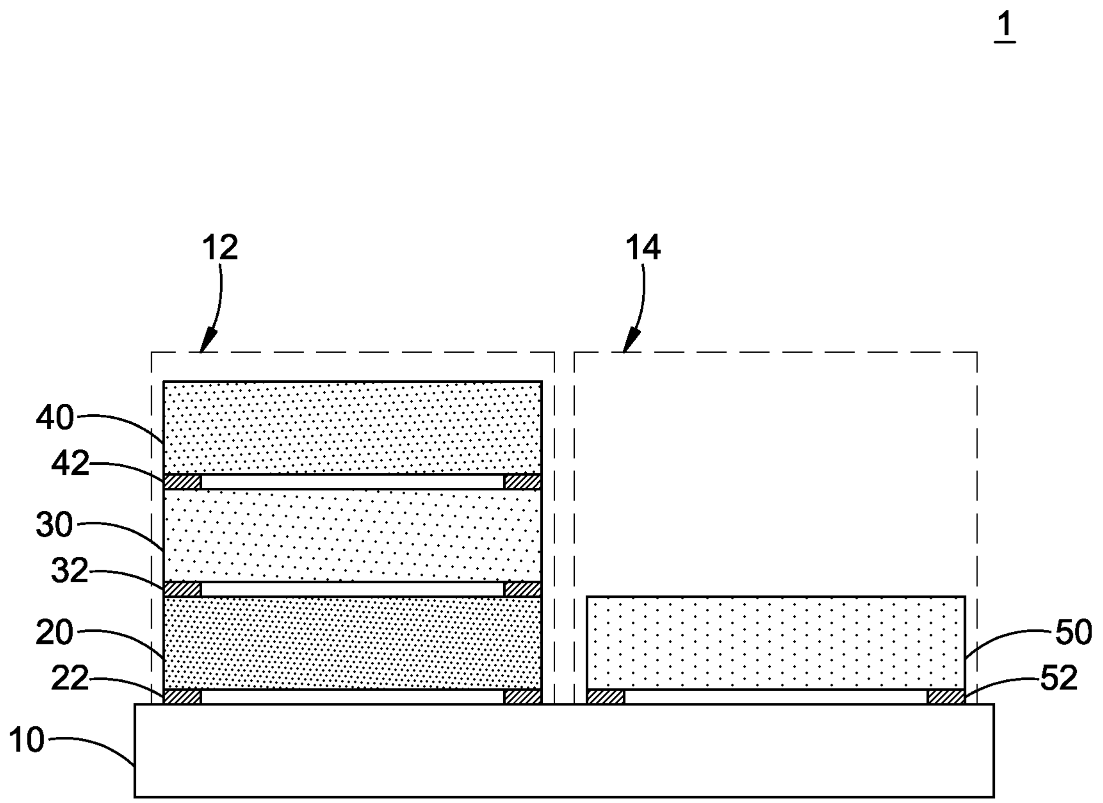
FIG. 1C shows a schematic diagram of the repairing structure according to an embodiment of the present invention.

Please refer to FIG. 1A, FIG. 1B, and FIG. 1C. FIG. 1A shows a schematic diagram of the structure according to an embodiment of the present invention; FIG. 1B shows a top view of the structure according to an embodiment of the present invention; and FIG. 1C shows a schematic diagram of the repairing structure according to an embodiment of the present invention. As shown in the figure, according to the present embodiment, a micro LED panel structure 1 comprises a substrate 10, a first light-emitting layer 20, a second light-emitting layer 30, and a third light-emitting layer 40. The layers are stacked on one another.

Figure 3:
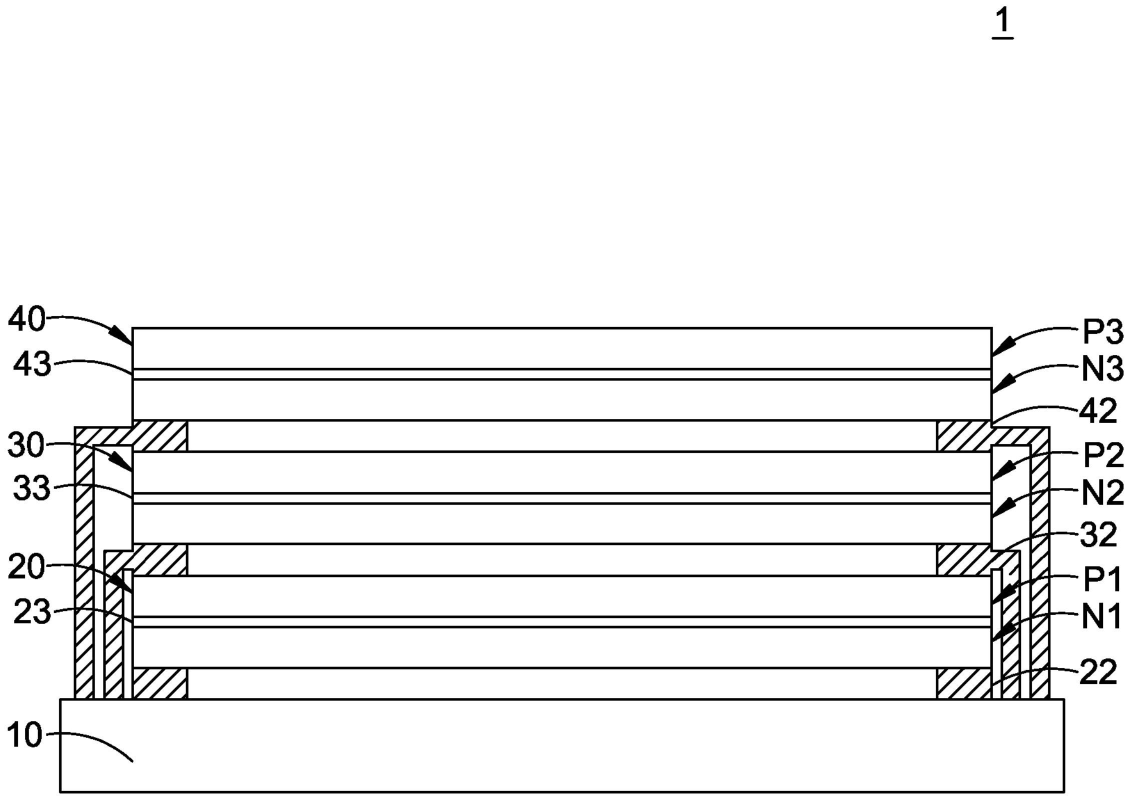
FIG. 3 shows a schematic diagram of the light-emitting layers according to an embodiment of the present invention.

Please refer again to FIG. 1A, FIG. 1B, FIG. 1C, and FIG. 3. FIG. 3 shows a schematic diagram of the light-emitting layers according to an embodiment of the present invention. As shown in the figure, according to the present embodiment, the substrate 10 includes a first region 12 and a second region 14 thereon. The first region 12 is disposed on one side of the second region 14. The first light-emitting layer 20 is disposed in the first region 12 of the substrate 10. The first light-emitting layer 20 is connected electrically to the substrate 10 via a first fan-out circuit layer 22 from the bottom. The second light-emitting layer 30 is disposed on the first light-emitting layer 20 and connected electrically to the first light-emitting layer 20 via a second fan-out circuit layer 32 from the bottom. The second fan-out circuit layer 32 is connected electrically to the first light-emitting layer 20 from one side of the second light-emitting layer 30. The third light-emitting layer 40 is disposed on the second light-emitting layer 30 and connected electrically to the second light-emitting layer 30 via a third fan-out circuit layer 42 from the bottom. The third fan-out circuit layer 42 is connected electrically to the second light-emitting layer 30 from one side of the third light-emitting layer 40.

According to the present embodiment, the wavelength of the light emitted from the first light-emitting layer 20 is different from the wavelength of the light emitted from the second light-emitting layer 30; the wavelength of the light emitted from the second light-emitting layer 30 is different from the wavelength of the light emitted from the third light-emitting layer 40; and the wavelength of the light emitted from the first light-emitting layer 20 is different from the wavelength of the light emitted from the third light-emitting layer 40. For example, the first light-emitting layer 20, the second light-emitting layer 30 and the third light-emitting layer 40 emit light with different colors.

Please refer again to FIG. 1A, FIG. 1B, and FIG. 1C. As shown in the figure, according to the present embodiment, when one or more of the first light-emitting layer 20, the second light-emitting layer 30 and the third light-emitting layer 40 in the first region 12 is damaged, one or more first alternate light-emitting layer 50 is disposed in the second region 14. For example, when the first light-emitting layer 20 emitting red light is damaged, the one or more first alternate light-emitting layer 50 emitting red light can be disposed in the second region 14 correspondingly for repairing the damaged first light-emitting layer 20. When the second light-emitting layer 30 emitting green light is damaged, the one or more first alternate light-emitting layer 50 emitting green light can be disposed in the second region 14 correspondingly for repairing the damaged second light-emitting layer 30. When the third light-emitting layer 40 emitting blue light is damaged, the one or more first alternate light-emitting layer 50 emitting blue light can be disposed in the second region 14 correspondingly for repairing the damaged third light-emitting layer 40.

According to the present embodiment, the one or more first alternate light-emitting layer 50 is connected electrically to the substrate 10 via a fourth fan-out circuit layer 52 from the bottom.

According to the present embodiment, the first fan-out circuit layer 22 of the first light-emitting layer 20, the second fan-out circuit layer 32 of the second light-emitting layer 30, the third fan-out circuit layer 42 of the third light-emitting layer 40, and the fourth fan-out circuit layer 52 of the one or more first alternate light-emitting layer 50 are formed by fan-out packaging. The significant feature of fan-out packaging is to make the redistribution layer broader and enable more pin count. Thereby, more functions can be integrated in a single chip and achieving substrate packaging, thinness, and low costs.

According to an embodiment, an air layer or an isolation layer can be disposed between the electrodes of the first fan-out circuit layer 22. Likewise, an air layer or an isolation layer can be disposed between the electrodes of the second fan-out circuit layer 32, the third fan-out circuit layer 42, and the fourth fan-out circuit layer 52. Nonetheless, the present invention is not limited to the embodiment.

According to the present embodiment, the first light-emitting layer 20, the second light-emitting layer 30, and the third light-emitting layer 40 are pervious to light correspondingly so that the light emitted from the first light-emitting layer 20, the second light-emitting layer 30, and the third light-emitting layer 40 can pass through.

According to an embodiment, the one or more first alternate light-emitting layer 50 can be, but not limited to, LEDs emitting blue ore ultraviolet light.

According to an embodiment, the material of the substrate 10 is selected from the group consisting of gallium nitride, gallium arsenide, gallium phosphide, indium phosphide, silicon carbide, and aluminum oxide. Nonetheless, the present invention is not limited to the embodiment.

According to an embodiment, the energy bandgap of the first light-emitting layer 20 is greater than the energy bandgap of the second light-emitting layer 30; the energy bandgap of the second light-emitting layer 30 is greater than the energy bandgap of the third light-emitting layer 40. Nonetheless, the present invention is not limited to the embodiment.

According to an embodiment, the energy bandgap of the first light-emitting layer 20 is smaller than the energy bandgap of the second light-emitting layer 30; the energy bandgap of the second light-emitting layer 30 is smaller than the energy bandgap of the third light-emitting layer 40. Nonetheless, the present invention is not limited to the embodiment.

According to an embodiment, the first light-emitting layer 20, the second light-emitting layer 30, and the third light-emitting layer 40 emit one of the red, green, and blue light. Nonetheless, the present invention is not limited to the embodiment.

According to an embodiment, the material of the first light-emitting layer 20, the second light-emitting layer 30, and the third light-emitting layer 40 are selected from the group consisting of gallium nitride, aluminum indium gallium phosphide, aluminum gallium arsenide, and aluminum gallium phosphide. Nonetheless, the present invention is not limited to the embodiment.

Figure 2:
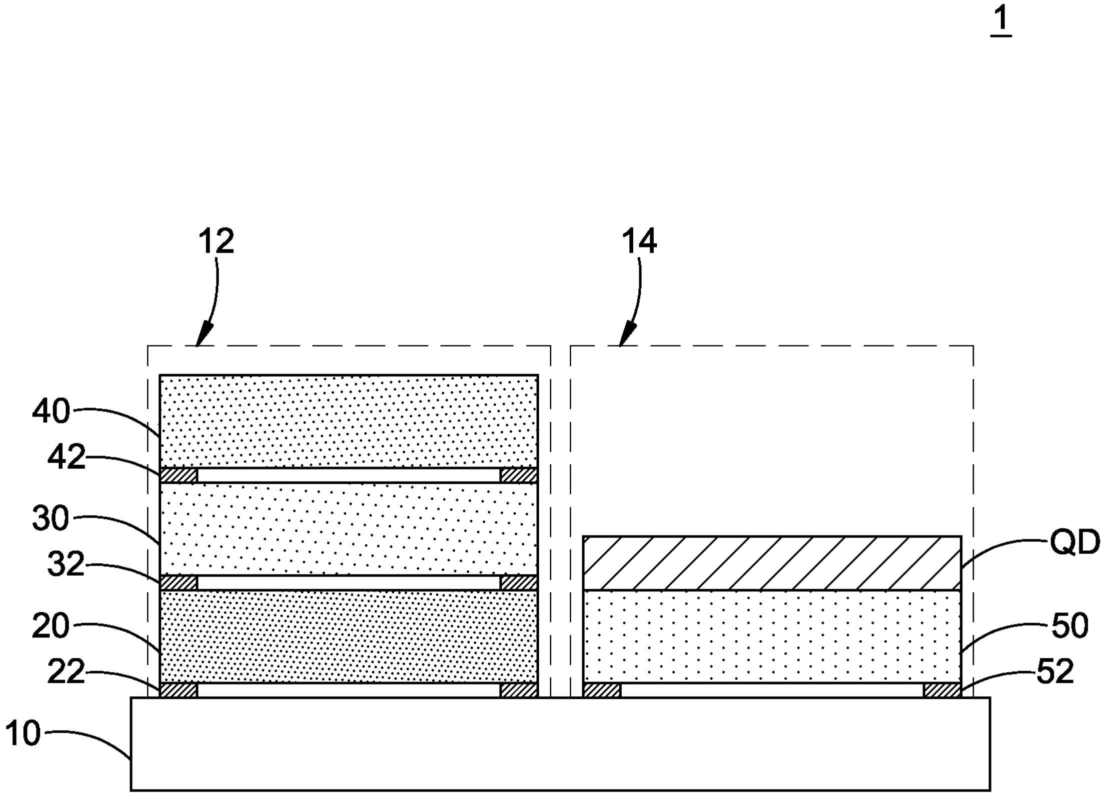
FIG. 2 shows a schematic diagram of the quantum dot according to an embodiment of the present invention.

Please refer to FIG. 2, which shows a schematic diagram of the quantum dot according to an embodiment of the present invention. As shown in the figure, the present embodiment is based on the previous one. According to the present embodiment, the micro LED panel structure further comprises a quantum dot layer QD disposed on the one or more first alternate light-emitting layer 50. According to an embodiment, the quantum dot layer QD can be disposed on the third light-emitting layer 40 correspondingly for adjusting the wavelength of the light emitted from the third light-emitting layer 40.

According to the present embodiment, the quantum dot in the quantum dot layer QD is a semiconductor nanostructure formed by confining excitons in three directions. The confinement can be formed by the electrostatic potential, the interface between two different semiconductor materials, the surface of the semiconductor, or the combination of the above. A quantum dot owns quantized energy spectrum. The corresponding wave function is located in the quantum dot in space but extended to several lattices. A quantum dot only has few integer multiples of electrons, holes, or electron-hole pairs with an integer multiple of fundamental charge.

According to the present embodiment, the fabrication method of quantum dots can be roughly classified into three types: growth by chemical solution, epitaxial growth (or namely extended growth), and confinement by an electric field.

The growth by chemical solution method is to synthesize cadmium sulfide colloid in aqueous solution. By changing the size of the cadmium sulfide colloid, the exciton energy will change accordingly and producing colloidal quantum dots. In an organic solution, uniform quantum dots will be synthesized. The growth by chemical solution method is to dissolve three chalcogens (sulfur, selenium, tellurium) in trioctylphosphine oxide. Next, it reacts with dimethyl cadmium in the organic solution at 200 to 300 Celsius degrees to produce quantum dot materials (cadmium sulfide, cadmium selenide, cadmium telluride) correspondingly. On this basis, many methods to synthesize colloidal quantum dots are developed in the industry. Currently, most semiconductor materials can be adopted to synthesize the corresponding quantum dots by using the growth by chemical solution method.

The epitaxial growth method refers to grow new crystals on a substrate material. If the crystal is tiny enough, quantum dots will be formed. According to different growth mechanisms, the method can be further classified into chemical vapor deposition and molecular beam epitaxy. The quantum dots by the epitaxial growth method is grown on another semiconductor and can be integrated with the traditional semiconductor devices with ease. In addition, since there is no organic ligand, the charge transfer efficiency of epitaxial quantum dots is higher than colloidal quantum dots with easily adjustable energy levels and fewer surface defects. Nonetheless, since both chemical vapor deposition and molecular beam epitaxy require high vacuum or ultra high vacuum, compared to colloidal quantum dots, epitaxial quantum dots are more expensive.

The confinement by electric field method is to distort the energy levels in semiconductor by controlling metal electrodes and forming confinement on carriers. Since the size of quantum dots is nanometer scale, the metal electrode must be fabricated by e-beam lithography making it most costly and lowest in yield. Nonetheless, the energy levels, the number of carriers, and spins of the quantum dots fabricated using this method can controlled easily by modulating the voltage.

Please refer to FIG. 3, which shows a schematic diagram of the light-emitting layers according to an embodiment of the present invention. As shown in the figure, according to the present embodiment, the first light-emitting layer 20, the second light-emitting layer 30, and third light-emitting layer 40 include an n-type semiconductor, a p-type semiconductor, and a light-emitting layer, respectively. In other words, the first light-emitting layer 20 includes an n-type semiconductor N1, a light-emitting layer 23, and a p-type semiconductor P1 stacked sequentially; the second light-emitting layer 30 includes an n-type semiconductor N2, a light-emitting layer 33, and a p-type semiconductor P2 stacked sequentially; and the third light-emitting layer 40 includes an n-type semiconductor N3, a light-emitting layer 43, and a p-type semiconductor P3 stacked sequentially. Thereby, the first light-emitting layer 20, the second light-emitting layer 30, and third light-emitting layer 40 form a light-emitting diode.

According to the present embodiment, the first light-emitting layer 20, the second light-emitting layer 30, and third light-emitting layer 40 are LEDs. The semiconductor material will be doped by impurities to form the p-n structure. Like other diodes, the current of an LED can flow from the p region (the anode) to the n region (the cathode) easily but not in the reverse direction. Two different carriers, holes and electrons, flow from the electrodes to the p-n structure under different voltages. When holes and electrons meet, they will recombine. Then the electrons will fall to lower energy levels and release energy by photons (the light). The first light-emitting layer 20, the second light-emitting layer 30, and third light-emitting layer 40 can be applied to micro LEDs, which are, but not limited to, micrometer-scale LEDs.

According to an embodiment, the one or more first alternate light-emitting layer 50 includes an n-type semiconductor, a p-type semiconductor, and a light-emitting layer (not shown in the figure) for forming an LED.

Figure 4:
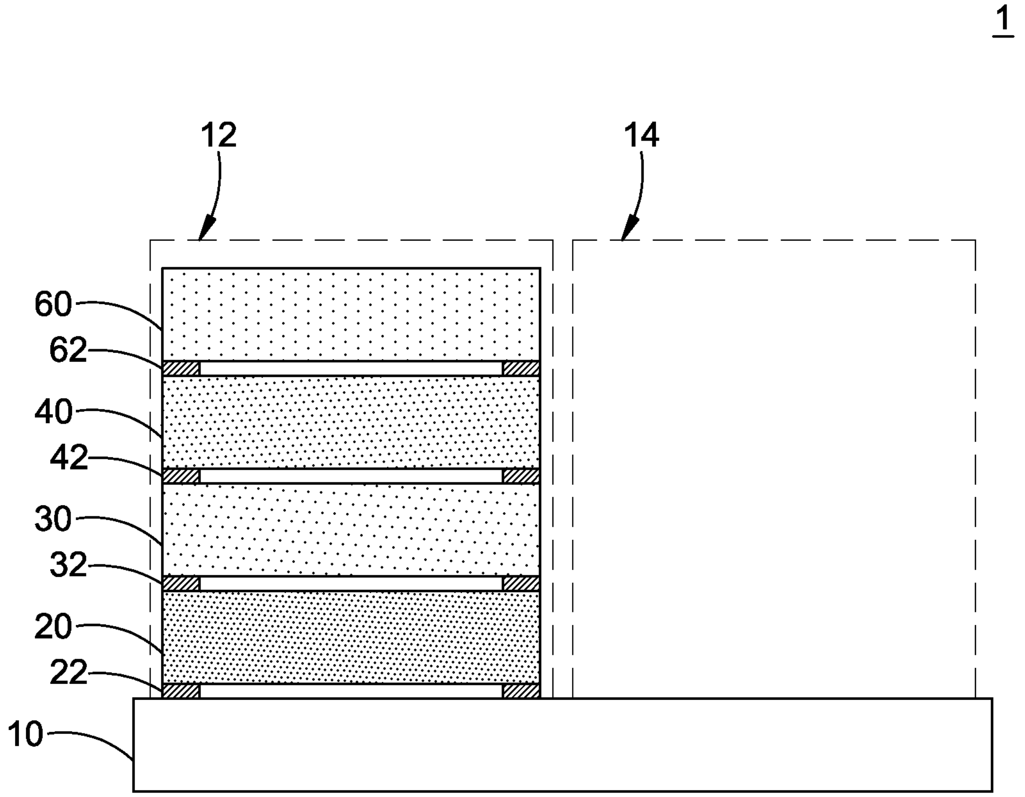
FIG. 4 shows a schematic diagram of the structure according to another embodiment of the present invention.

Please refer to FIG. 4, which shows a schematic diagram of the structure according to another embodiment of the present invention. As shown in the figure, according to the present embodiment, the micro LED panel structure further comprises one or more second alternate light-emitting layer 60. When one or more of the first light-emitting layer 20, the second light-emitting layer 30 and the third light-emitting layer 40 in the first region 12 is damaged, one or more second alternate light-emitting layer 60 is disposed on the third light-emitting layer 40. For example, when the first light-emitting layer 20 emitting red light is damaged, the one or more second alternate light-emitting layer 60 emitting red light can be disposed on the third light-emitting layer 40 correspondingly for repairing the damaged first light-emitting layer 20. When the second light-emitting layer 30 emitting green light is damaged, the one or more second alternate light-emitting layer 60 emitting green light can be disposed on the third light-emitting layer 40 correspondingly for repairing the damaged second light-emitting layer 30. When the third light-emitting layer 40 emitting blue light is damaged, the one or more second alternate light-emitting layer 60 emitting blue light can be disposed on the third light-emitting layer 40 correspondingly for repairing the damaged third light-emitting layer 40.

According to the present embodiment, the one or more second alternate light-emitting layer 60 is connected electrically to the third light-emitting layer 40 via a fifth fan-out circuit layer 62 from the bottom.

According to an embodiment, the wavelength of the light emitted from the one or more second alternate light-emitting layer 60 is different from the wavelength of the light emitted from the third light-emitting layer 40. Thereby, the one or more second alternate light-emitting layer 60 and the third light-emitting layer 40 emit light with different colors (including ultraviolet and infrared).

According to an embodiment, the one or more second alternate light-emitting layer 60 includes an n-type semiconductor, a p-type semiconductor, and a light-emitting layer (not shown in the figure) for forming an LED.

Figure 5:
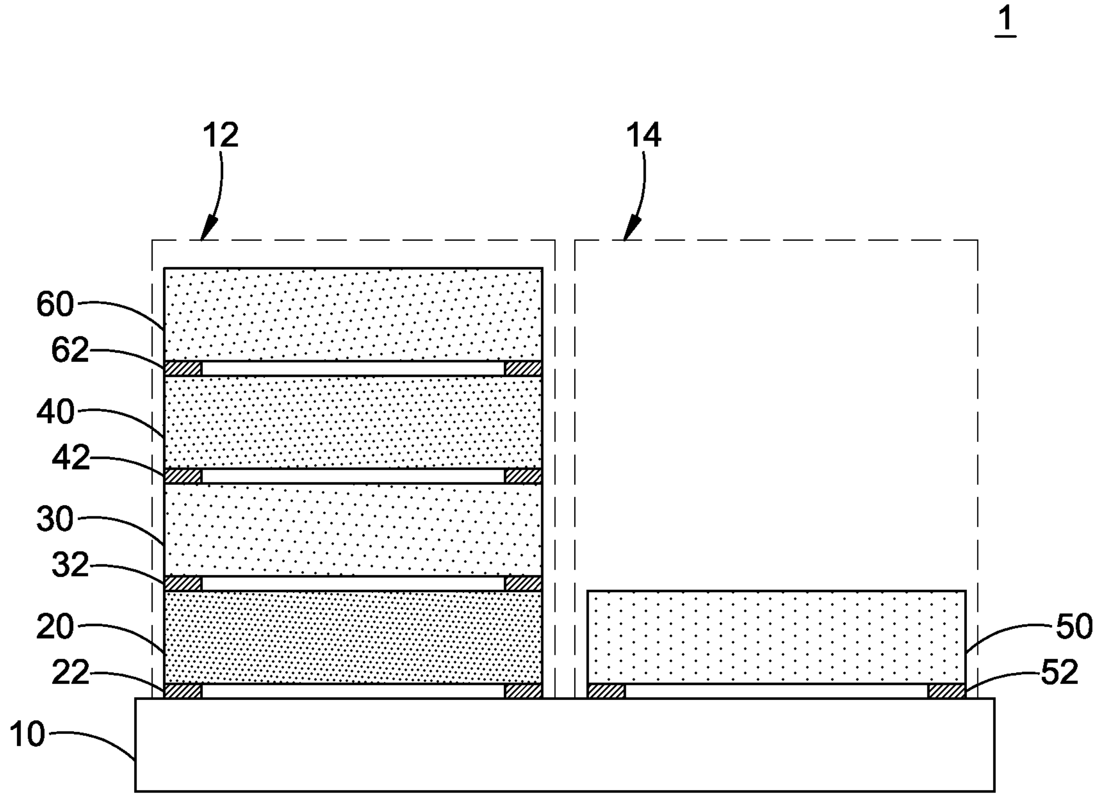
FIG. 5 shows a schematic diagram of the repairing structure according to another embodiment of the present invention.

Please refer to FIG. 5, which shows a schematic diagram of the repairing structure according to another embodiment of the present invention. As shown in the figure, according to the present embodiment, the one or more first alternate light-emitting layer 50 and the one or more second alternate light-emitting layer 60 can be disposed concurrently for repairing the damaged light-emitting layers. When one or more of the first light-emitting layer 20, the second light-emitting layer 30 and the third light-emitting layer 40 in the first region 12 is damaged, one or more first alternate light-emitting layer can be disposed in the second region 14 and one or more second alternate light-emitting layer 60 can be disposed on the third light-emitting layer 40. For example, when the first light-emitting layer 20 emitting red light and the second light-emitting layer 30 emitting green light are damaged, the one or more second alternate light-emitting layer 60 emitting red light can be disposed on the third light-emitting layer 40 correspondingly and the one or more first alternate light-emitting layer 50 can be disposed in the second region 14 for repairing the damaged first light-emitting layer 20 and second light-emitting layer 30.

Figure 6:
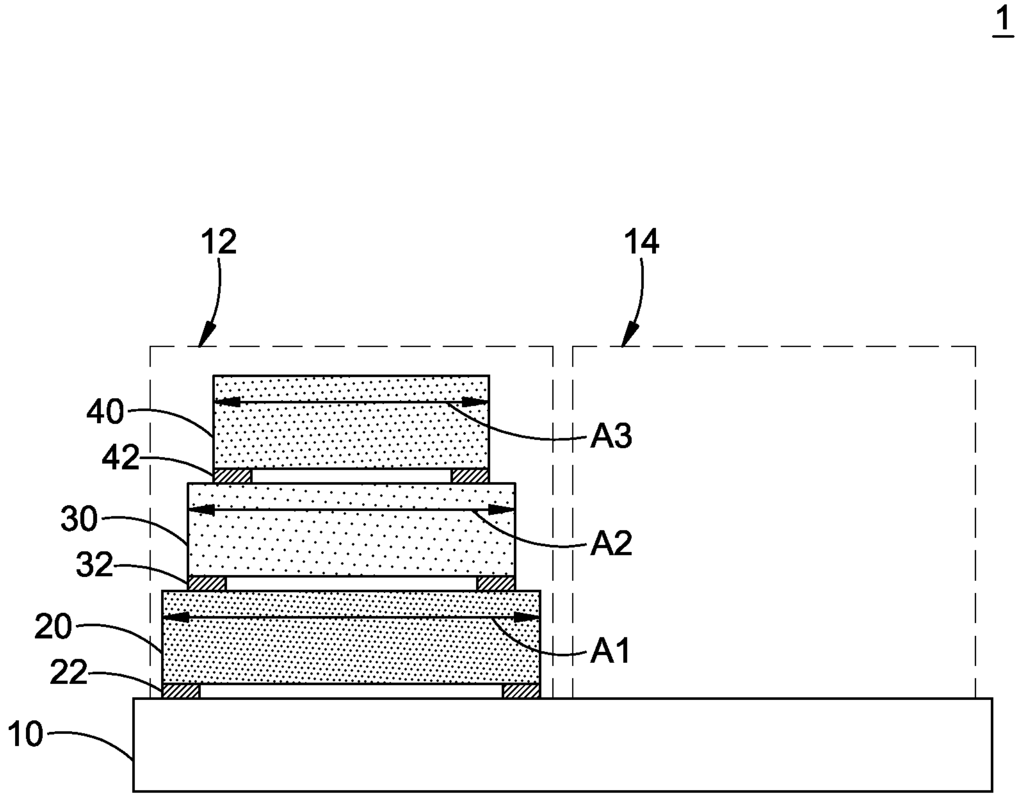
FIG. 6 shows a schematic diagram of the structure according to another embodiment of the present invention.

Please refer to FIG. 6, which shows a schematic diagram of the structure according to another embodiment of the present invention. As shown in the figure, according to the present embodiment, the first light-emitting layer 20 includes a first area A1; the second light-emitting layer 30 includes a second area A2; the third light-emitting layer 40 includes a third area A3. The first area A1 of the first light-emitting layer 20 is greater than the second area A2 of the second light-emitting layer 30. The second area A2 of the second light-emitting layer 30 is greater than the third area A3 of the third light-emitting layer 40. Thereby, the shading of the first light-emitting layer 20, the second light-emitting layer 30, and the third light-emitting layer 40 of the micro LED panel structure 1 to one another can be adjusted. The other components of the present embodiment are the same as those described in the above embodiments. Hence, the details will not be described again.

To sum up, the present invention provides a micro LED panel structure, in which two or more regions are disposed on the substrate. A first region includes a plurality of light-emitting layers stacked vertically and connected electrically to one another via fan-out packaging. A second region is reserved in advance. When one or more of the plurality of light-emitting layers is damaged, one or more alternate light-emitting layer is disposed in the second region of the substrate for replacing the abnormal light-emitting layer and repairing the micro LED panel. Hence, the problem of defective pixels owing to abnormal or damaged LEDs on the panel according to the prior art can be solved.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A micro light-emitting diode panel structure, comprising:

a substrate, including a first region and a second region thereon, and said first region disposed on one side of said second region;

a first light-emitting layer, disposed in said first region, and connected electrically to said substrate via a first fan-out circuit layer;

a second light-emitting layer, disposed on said first light-emitting layer and connected electrically to said first light-emitting layer via a second fan-out circuit layer, and said second fan-out circuit layer connected electrically to said substrate; and a third light-emitting layer, disposed on said second light-emitting layer and connected electrically to said second light-emitting layer via a third fan-out circuit layer, and said third fan-out circuit layer connected electrically to said substrate;

one or more first alternate light-emitting layer, disposed in said second region;

wherein the wavelengths of the light emitted from said first light-emitting layer, said second light-emitting layer, and said third light-emitting layer are different; wherein at least one of said first light-emitting layer, said second light-emitting layer, and said third light-emitting layer is a damaged light-emitting layer; wherein the one or more first alternate light-emitting layer emits light of the same color as the damaged light-emitting layer to serve as a replacement light source for the damaged light-emitting layer; and said one or more first alternate light-emitting layer is connected electrically to said substrate via a fourth fan-out circuit layer.

2. The micro light-emitting diode panel structure of claim 1, wherein the material of said substrate is selected from the group consisting of gallium nitride, gallium arsenide, gallium phosphide, indium phosphide, silicon carbide, and aluminum oxide.

3. The micro light-emitting diode panel structure of claim 1, further comprising a quantum dot layer disposed on said one or more first alternate light-emitting layer.

4. The micro light-emitting diode panel structure of claim 1, further comprising one or more second alternate light-emitting layer disposed on said third light-emitting layer.

5. The micro light-emitting diode panel structure of claim 4, wherein said one or more second alternate light-emitting layer is connected electrically to said third light-emitting layer via a fifth fan-out circuit layer.

6. The micro light-emitting diode panel structure of claim 4, wherein the wavelength of the light emitted from said one or more second alternate light-emitting layer is different from the wavelength of the light emitted from said third light-emitting layer.

7. The micro light-emitting diode panel structure of claim 1, wherein said first light-emitting layer, said second light-emitting layer, and said third light-emitting layer include an n-type semiconductor, a p-type semiconductor, and a light-emitting layer, respectively.

8. The micro light-emitting diode panel structure of claim 1, wherein the energy bandgap of said first light-emitting layer is greater than the energy bandgap of said second light-emitting layer; the energy bandgap of said second light-emitting layer is greater than the energy bandgap of said third light-emitting layer.

9. The micro light-emitting diode panel structure of claim 1, wherein the energy bandgap of said first light-emitting layer is smaller than the energy bandgap of said second light-emitting layer; the energy bandgap of said second light-emitting layer is smaller than the energy bandgap of said third light-emitting layer.

10. The micro light-emitting diode panel structure of claim 1, wherein a first area of said first light-emitting layer is greater than a second area of said second light-emitting layer; and said second area is greater than a third area of said third light-emitting layer.

11. A micro light-emitting diode panel structure, comprising:

a plurality of pixels, and one of the pixels comprising:

a first region and a second region, said first region disposed on one side of said second region, and said second region is a repaired region;

a first light-emitting layer, disposed in said first region and configured to emit red light;

a second light-emitting layer, disposed in said first region and configured to emit green light;

a third light-emitting layer, disposed in said first region and configured to emit blue light; and a first alternate light-emitting layer, disposed in said second region and configured to emit light with colors selected from red, blue and green wherein at least one of said first light-emitting layer, said second light-emitting layer, and said third light-emitting layer is a structurally damaged light-emitting layer, and said first alternate light-emitting layer serves as a replacement for the structurally damaged light-emitting layer and emits light of the same color as the structurally damaged light-emitting layer.

12. The micro light-emitting diode panel structure of claim 11, further comprising a quantum dot layer disposed on said first alternate light-emitting layer.

13. The micro light-emitting diode panel structure of claim 11, further comprising a second alternate light-emitting layer, disposed in said first region and configured to emit light with colors selected from red, blue and green, wherein the light emit from the second alternate light-emitting layer is different from the light emitted from the first alternate light-emitting layer.

* * * * *